(12) United States Patent
Al-sa'di et al.

(10) Patent No.: US 10,158,002 B2
(45) Date of Patent: Dec. 18, 2018

(54) SEMICONDUCTOR SWITCH DEVICE

(71) Applicant: NXP B.V., Eindhoven (NL)

(72) Inventors: Mahmoud Al-sa'di, Kranenburg (DE); Petrus Magnee, Malden (NL); Johannes Donkers, Valkenswaard (NL); Ihor Brunets, Kleve (DE); Joost Melai, Weurt (NL)

(73) Assignee: NXP B.V., Eindhoven (NL)

( * ) Notice: Subject to any disclaimer, the term of this patent is extended or adjusted under 35 U.S.C. 154(b) by 3 days.

(21) Appl. No.: 15/678,021

(22) Filed: Aug. 15, 2017

(65) Prior Publication Data

US 2018/0053833 A1  Feb. 22, 2018

(30) Foreign Application Priority Data

Aug. 17, 2016  (EP) .................................... 16184454

(51) Int. Cl.
*H01L 29/66* (2006.01)
*H01L 21/265* (2006.01)
*H01L 29/78* (2006.01)

(52) U.S. Cl.
CPC ........ *H01L 29/6659* (2013.01); *H01L 21/265* (2013.01); *H01L 29/7833* (2013.01); *H01L 29/6656* (2013.01)

(58) Field of Classification Search
CPC ............. H01L 29/6659; H01L 29/6656; H01L 29/7833
See application file for complete search history.

(56) References Cited

U.S. PATENT DOCUMENTS

| 5,714,413 | A | 2/1998 | Bringham et al. |
| 5,793,089 | A | 8/1998 | Fulford, Jr. et al. |
| 5,869,378 | A | 2/1999 | Michael |
| 6,013,570 | A | 1/2000 | Yu et al. |
| 6,167,063 | A | 12/2000 | Iiboshi |
| 6,660,605 | B1 * | 12/2003 | Liu ..................... H01L 29/6653 257/E21.345 |

(Continued)

OTHER PUBLICATIONS

Eyben, Pierre et al; "Two-dimensional Carrier Profiling with Sub-nm Resolution Using SSRM: From Basic Concept to TCAD Calibration and Device Tuning"; Ext. Abs. the 9th Int'l Workshop on Junction Technology 2009; IEEE Conference Publications; pp. 74-78 (2009).

*Primary Examiner* — David Spalla

(57) ABSTRACT

A method of making a semiconductor switch device and a semiconductor switch device made according to the method. The method includes depositing a gate dielectric on a major surface of a substrate. The method also includes depositing and patterning a gate electrode on the gate dielectric. The method further includes depositing an oxide to cover the top surface and sidewall(s) of the gate electrode. The method also includes, after depositing the oxide, performing a first ion implantation process at a first implantation dosage for forming a lightly doped drain region of the switch device. The method further includes forming sidewall spacers on the sidewall(s) of the gate electrode. The method also includes performing a second ion implantation process at a second implantation dosage for forming a source region and a drain region of the semiconductor switch device. The second implantation dosage is greater than the first implantation dosage.

15 Claims, 5 Drawing Sheets

(56) References Cited

U.S. PATENT DOCUMENTS

| | | |
|---|---|---|
| 7,449,387 B2 | 11/2008 | Lee |
| 2005/0136589 A1* | 6/2005 | Rotondaro ........ H01L 21/28176 438/240 |
| 2006/0099744 A1* | 5/2006 | Chidambaram .. H01L 21/28044 438/142 |
| 2015/0155381 A1* | 6/2015 | Song .................. H01L 29/6653 257/408 |

* cited by examiner

SEMICONDUCTOR SWITCH DEVICE

CROSS-REFERENCE TO RELATED APPLICATIONS

This application claims the priority under 35 U.S.C. § 119 of European patent application no. 16184454.3, filed Aug. 17, 2016 the contents of which are incorporated by reference herein.

BACKGROUND

The present specification relates to a method of making a semiconductor switch device and to a semiconductor switch device.

Metal Oxide Semiconductor Field Effect Transistors (MOSFETs) can be used as electric switches for high Radio Frequency (RF) signals. For these applications the device does not actually switch at high frequencies, rather it passes or blocks RF signals. Best performance is achieved with a device that combines low series resistance in on-state with low input capacitance in off-state. One of the most popular ways to evaluate the overall performance of an RF Switch MOSFET is to calculate a figure of merit (FOM), which is defined as the product of the on-state resistance ($R_{on}$) and the off-state capacitance ($C_{off}$).

During transistor operations, electrons travel in the channel of an NMOSFET. At the drain side of the channel, where the electrical field is usually maximum, a few electrons can gain a sufficiently high kinetic energy to overcome the Si—$SiO_2$ energy barrier and be injected into the gate oxide. Those electrons are called "hot" since their energy is (much) higher than that of electrons in thermal equilibrium with the silicon lattice. Hot electrons can also produce impact ionization in the silicon and create new electron-hole pairs which, in turn, may be injected into the gate oxide. Part of injected electrons may be trapped in electron traps, in the $SiO_2$ or at its interface with Si (dangling bonds), where they may induce a change (degradation) of the electrical characteristics of the device. Energetic electrons injected into the $SiO_2$ may also create new traps. In order to reduce hot-carrier injection effects, the electric field at the drain side of the channel may be reduced by smoothening the doping profile. This may be achieved by implanting a shallow region of Arsenic or Phosphorus (in case of NMOS), with a reduced concentration with respect to the drain implant. This lightly doped drain (LDD) region may also play a role in reducing the series resistance of the channel.

However, use of an LDD in a MOSFET may generally result in an increase in the overlap capacitance of the device, that is, the gate-to-source ($C_{gs}$) and gate-to-drain ($C_{gd}$) capacitances. The overlap capacitance may constitute significant fraction of the total off-state capacitance ($C_{off}$) of the device, as shown in the following formulas:

$$C_{off} = \left( \frac{1}{C_{dd} - C_{ds}} + \frac{1}{C_{ss} - C_{ds}} \right)^{-1} + C_{ds}$$

$$C_{ss} = C_{sd} + C_{sg} + C_{sb}$$

$$C_{dd} = C_{ds} + C_{dg} + C_{db}$$

$$C_{gg} = C_{gs} + C_{gd} + C_{gb}.$$

Where $C_{ds}$ is the channel capacitance, and $C_{sb}$, $C_{db}$ and $C_{gb}$ are the source to bulk, drain to bulk and gate to bulk capacitances, respectively.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a method of making a semiconductor switch device, the method comprising:

providing a semiconductor substrate having a major surface;

depositing a gate dielectric on the major surface of the substrate;

depositing and patterning a gate electrode on the gate dielectric, wherein the gate electrode has a top surface and at least one sidewall;

depositing an oxide to cover the top surface and sidewall(s) of the gate electrode;

after depositing the oxide to cover the top surface and sidewall(s) of the gate electrode, performing a first ion implantation process at a first implantation dosage for forming a lightly doped drain region of the switch device;

forming sidewall spacers on the sidewall(s) of the gate electrode; and performing a second ion implantation process at a second implantation dosage for forming a source region and a drain region of the semiconductor switch device, wherein the second implantation dosage is greater than the first implantation dosage.

By performing the first ion implantation process after depositing the oxide to cover the top surface and sidewall(s) of the gate electrode, the overlap capacitance of the device may be reduced. This may lead to a reduction in the off-state capacitance $C_{off}$ of the device, in turn resulting in improvement in the figure of merit (FOM) of the device, given by $FOM = R_{on} * C_{off}$.

The first ion implantation process may be performed before the sidewall spacers are formed, so as to allow the first implant to reach closer to the channel region of the gate.

The first ion implantation process for forming the lightly doped drain region may be a single ion implantation step using a single mask. This may simplify the manufacturing process, potentially increasing yield and reducing costs.

In some embodiments, a layer of oxide may be grown on the sidewall(s) of the gate electrode, prior to depositing the oxide to cover the top surface and sidewall(s) of the gate electrode.

The ions implanted in the first and/or the second implantation process may, in the case of an n-channel device (NMOS), be Arsenic, Phosphorus or Antimony. In the case of a p-channel device (PMOS), Boron or Indium may be used.

Where arsenic is used, the implantation energy of the first implant may be in the range $1 \leq E_1 \leq 100$ keV. It is particularly envisaged that the energy of the first implant may be in the range $5 \leq E_1 \leq 50$ keV.

Where arsenic is used, the implantation energy of the second implant may be in the range $10 \leq E_2 \leq 200$ keV. It is particularly envisaged that the energy of the second implant may be in the range $20 \leq E_2 \leq 100$ keV.

Where arsenic is used, the first dosage may be in the range $1e14 \leq d_1 \leq 1e16$ ions/$cm^2$. It is particularly envisaged that the first dosage may be in the range $1e15 \leq d_1 \leq 5e15$ ions/$cm^2$.

Where arsenic is used, the second dosage may be in the range $1e15 \leq d_2 \leq 1e16$ ions/cm². It is particularly envisaged that the second dosage may be in the range $1e15 \leq d_1 \leq 5e15$ ions/cm².

The lightly doped drain region may extend into the substrate to a first depth from the major surface. The source and drain regions may extend into the substrate to a second depth from the major surface. The second depth may be greater than the first depth. Accordingly the lightly doped drain region may be shallower than the source and the drain.

The device may include both a lightly doped drain region and a lightly doped source region. Depositing and patterning the gate electrode may include determining a lateral dimension of the gate for choosing a channel length of the device according to the lateral separation of the lightly doped drain region and the lightly doped source region. This may allow an effective increase in the channel length (owing to the increased separation of the lightly doped regions of the drain and the source) to be compensated for by choosing a narrower gate.

According to another aspect of the present disclosure, there may be provided a semiconductor switch device made using the method described above.

A device of the kind described herein may be an RF switch device, for switching an RF signal. For the purposes of this disclosure "Radio Frequency" (RF) refers to frequencies typically in the range of, but not limited to $0.5 \text{ GHz} \leq f \leq 90 \text{ GHz}$. Note that although a semiconductor switch device according to embodiments of this disclosure may be used to pass or block an RF signal, typically the device would not actually switch at the RF frequency itself.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

FIGS. 1A-1E show a method of making a semiconductor switch device according to an embodiment of the present disclosure.

Figure 1A:
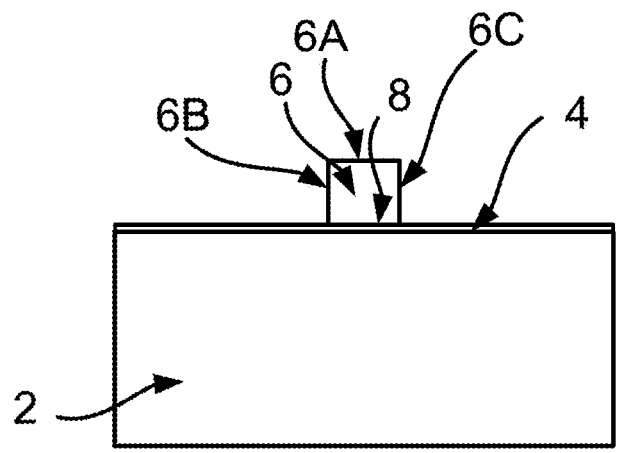
FIGS. 1A-1E show a method of making a semiconductor switch device according to an embodiment of the present disclosure.

In a first step shown in FIG. 1A, there is provided a semiconductor substrate 2. The substrate 2 may, for instance, comprise silicon. In some examples, the substrate may include an upper layer of epitaxially grown silicon, in which the features of the semiconductor switch device to be described below may be formed. The substrate 2 may be a so-called Silicon-on-Insulator (SOI) substrate, in which the upper layer of silicon is epitaxially grown on an insulating layer. Alternatively, the substrate 2 may comprise a bulk silicon wafer.

The substrate 2 has a major surface 4. The major surface 4 may be an upper surface of an epitaxially grown silicon wafer of the kind described above.

As shown in FIG. 1A, a gate dielectric 8 may be deposited on the major surface 4. The gate dielectric may, for instance, comprise $SiO_2$. After the gate dielectric 8 has been deposited, a gate electrode material may be deposited on the gate dielectric 8. The gate electrode material may be patterned in a mask and etch process, to produce a gate electrode 6 of the desired shape and dimensions. The gate electrode material may, for instance, be polysilicon.

As can be seen in FIG. 1A, the gate electrode 6 has a top surface 6A and at least one sidewall 6B, 6C.

Figure 1B:
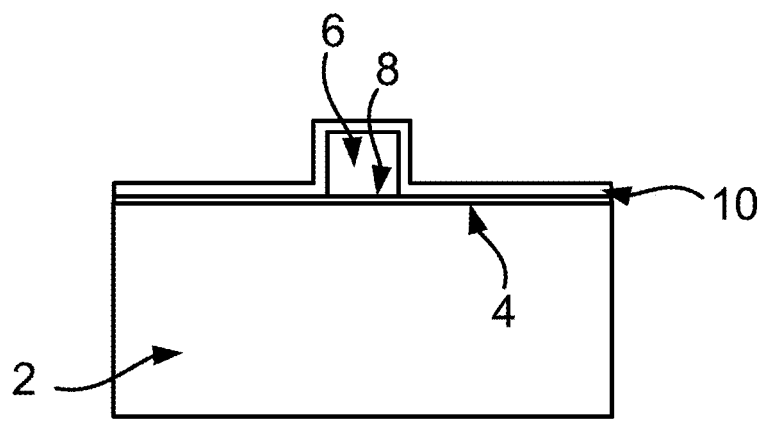

In a next step shown in FIG. 1B, an oxide layer 10 may be deposited. The oxide layer 10 covers the top surface 6A and the sidewall(s) 6B, 6C, and may also cover the parts of the gate dielectric 8 which extend outwardly from the edges of the gate. The oxide layer 10 will subsequently form part of the spacers of the gate, as will be described in more detail below. The oxide layer 10 may, for instance, comprise $SiO_2$ produced from Tetraethyl orthosilicate (TEOS). The oxide layer 10 may have a thickness of around 200 Angstroms.

In one example, prior to the deposition of the oxide layer 10, a thin layer (e.g. around 2 nm) of oxide may first be thermally grown on the top surface 6A and the sidewall(s) 6B, 6C.

Figure 1C:
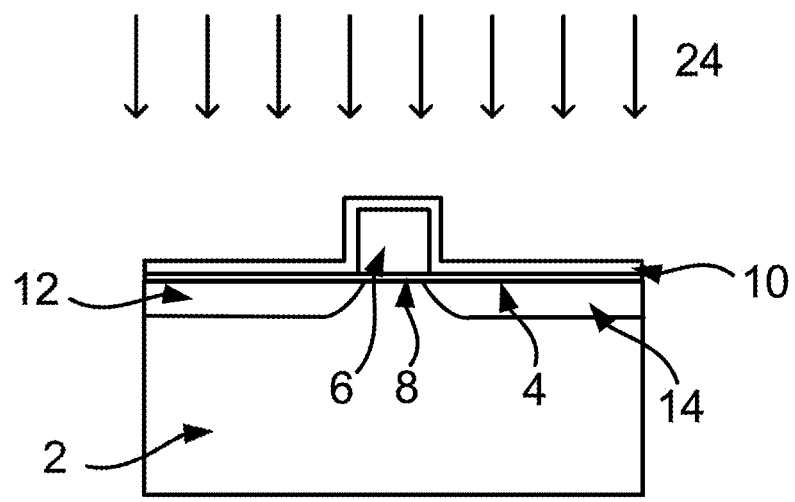

In a next step shown in FIG. 1C, after depositing the oxide layer 10, a first ion implantation process (schematically illustrated by the arrows labelled 24 in FIG. 1C) is performed. The ions may, in the case of an n-channel device (NMOS), be Arsenic, Phosphorus or Antimony. In the case of a p-channel device (PMOS), Boron or Indium may be used.

Where Arsenic is used, the implantation dosage of the first ion implantation process may be in the range $1e14 \leq d_1 \leq 1e16$ ions/cm². It is particularly envisaged that the first dosage may be in the range $1e15 \leq d_1 \leq 5e15$ ions/cm². The implantation dosage of the first implantation process may thus be relatively light. The first implantation process implants dopants into the substrate 2 on either side of the gate electrode 6 for forming a lightly doped drain region 14 of the switch device. As can be seen in FIG. 1C, the first ion implantation process may also form a lightly doped region on the source side of the device, which will be referred to herein after as a lightly doped source region 12.

Where arsenic is used, the implantation energy of the first implant may be in the range $1 \leq E_1 \leq 100$ keV. It is particularly envisaged that the energy of the first implant may be in the range $5 \leq E_1 \leq 50$ keV. The energy may be chosen in accordance with factors such as the desired doping profile of the lightly doped regions 12, 14, and the thickness and compositions of the gate dielectric 8 and oxide layer 10.

In accordance with an embodiment of the present disclosure, it has been found that by performing the first ion implantation process for forming the lightly doped drain region 14 (and lightly doped source region 12) of the switch device after the oxide layer 10 has been deposited, the overlap capacitance of the switch device may be reduced. This is because the oxide layer 10 may mask the areas of the substrate 2 located adjacent the edges of the gate during the first implantation process, whereby the lightly doped regions 12, 14 may be spaced from the edges of the gate. In this respect, it is noted that the thickness of the oxide layer 10 at the edges of the gate, along a vertical direction substantially parallel to the surface normal of the major surface 4 of the substrate 2 is thicker than it is in other locations (e.g. in locations away from the edges of the gate).

In principle, by forming a thicker oxide layer 10 on the gate electrode 6, the lightly doped regions 12, 14 may be spaced at a distance further away from the edges of the gate. On the other hand, by forming a thinner oxide layer 10, the lightly doped regions 12, 14 may be spaced at a distance closer to the edges of the gate. It is envisaged that the implantation energy used for the first implantation process may be chosen according to the thickness of the oxide layer 10, so that the ions may penetrate the parts of the oxide layer 10 located away from the edges of the gate effectively, to allow the lightly doped regions 12, 14 to be formed. Typically, for a thicker oxide layer 10, a higher implantation energy may be used, and vice versa.

The reduction in the overlap capacitance described above may lead to a reduction in the off-state capacitance $C_{off}$ of the device, in turn resulting in improvement in the figure of merit (FOM) of the device, given by FOM=$R_{on}*C_{off}$. In the present example, the first ion implantation process for forming the lightly doped region(s) may require only a single ion implantation step and may only require a single mask. This is in contrast to attempts to tailor the doping profile of the lightly doped regions 12, 14 using multiple masks and implantation steps, which may be complicated and which may therefore reduce yield.

In one example, the above described deposition and patterning of the gate electrode 6 may include determining a lateral dimension of the gate electrode 6 for choosing a channel length of the device according to the lateral separation of the lightly doped drain region 14 and the lightly doped source region 12. For instance, the reduced overlap capacitance of the device may allow the channel length of the device to be reduced.

Figure 1D:
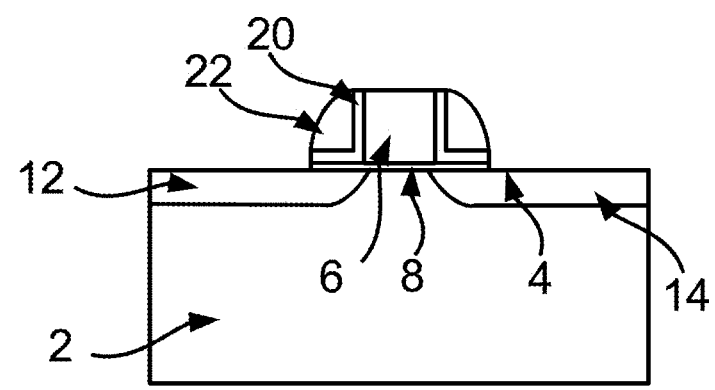

In a next step shown in FIG. 1D, sidewall spacers are formed on the sidewall(s) 6A, 6B of the gate electrode 6. Note that in accordance with embodiment of this disclosure, the first ion implantation process may be performed prior to the formation of these spacers, while the second ion implantation process to be described below (for forming the source and drain regions of the device) may be performed only after the sidewall spacers have been formed.

Formation of the sidewall spacers may be implemented, for instance, by depositing a layer (e.g. around 800 Angstroms) of silicon nitride over the oxide layer 10 and then etching until the nitride is mostly removed. The etching may also remove the part of the oxide layer 10 that is located on the top surface 6A of the gate electrode 6. The etching may further remove the parts of the oxide layer 10 that are located to either side of the gate (i.e. the parts located above the subsequently formed source and drain regions). The etching may also remove the parts of the gate dielectric 8 that are located to either side of the gate (i.e. the parts located above the subsequently formed source and drain regions). FIG. 1D shown the device following this etching step. Note that a part 22 of the nitride layer remains adjacent each of the edges (sidewalls 6B, 6C) of the gate electrode 6. Note that a part 20 of the oxide layer 10 also remains, having been masked by the overlying parts 22. The part 20 may be substantially L-shaped in cross section. The nitride parts 22 and oxide parts 20 may together form gate sidewall spacers of the device.

Figure 1E:
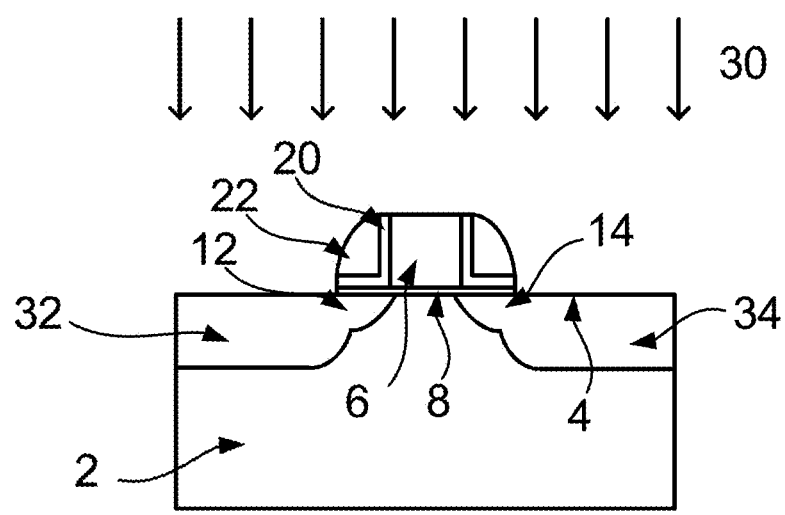

In a next step shown in FIG. 1E, a second ion implantation process (schematically illustrated by the arrows labelled 30 in FIG. 1E) is performed. The second ion implantation process implants dopants on either side of the gate to form the source region 32 and drain region 34 of the device. The second ion implantation process may implant dopants over a similar area to the first ion implantation process. Note, however, that during the second ion implantation process, the sidewall spacers mask the edges of the gate, so that the source region 32 and drain region 34 of the device are spaced away from the edges of the gate electrode 6. In contrast, the lightly doped regions 12, 14 may extend closer to the edges of the gate electrode 6 than the source region 32 and drain region 34.

The ions for the second implantation process may, in the case of an n-channel device (NMOS), be Arsenic, Phosphorus or Antimony. In the case of a p-channel device (PMOS), Boron may be used. It is also envisaged that Indium may be used. Typically, the choice of ions for the second implantation process may be the same as those used in the first implantation process.

Where arsenic is used, the implantation energy of the second implant is in the range $10 \leq E_2 \leq 200$ keV. It is particularly envisaged that the energy of the second implant may be in the range $20 \leq E_2 \leq 100$ keV. The energy may be chosen in accordance with the desired doping profile of the source region 32 and the drain region 34.

The lightly doped regions 12, 14 may extend into the substrate 2 to a first depth from the major surface 4. The source region 32 and the drain region 34 may extend into the substrate 2 to a second depth from the major surface 4. As can be seen by comparison of FIGS. 1C and 1E, the source region 32 and the drain region 34 may extend into the substrate 2 to a greater depth than the lightly doped regions 12, 14 (i.e. the second depth is greater than the first depth).

The dosage of the second ion implantation process (which is for forming the source region 32 and the drain region 34) may generally be greater than the dosage of the first implantation (which is for forming the lightly doped regions 12, 14). Where arsenic is used, the dosage of the second ion implantation process may be in the range $1e15 \leq d_2 \leq 1e16$ ions/cm$^2$. It is particularly envisaged that the second dosage may be in the range $1e15 \leq d_1 \leq 5e15$ ions/cm$^2$.

Figure 2:
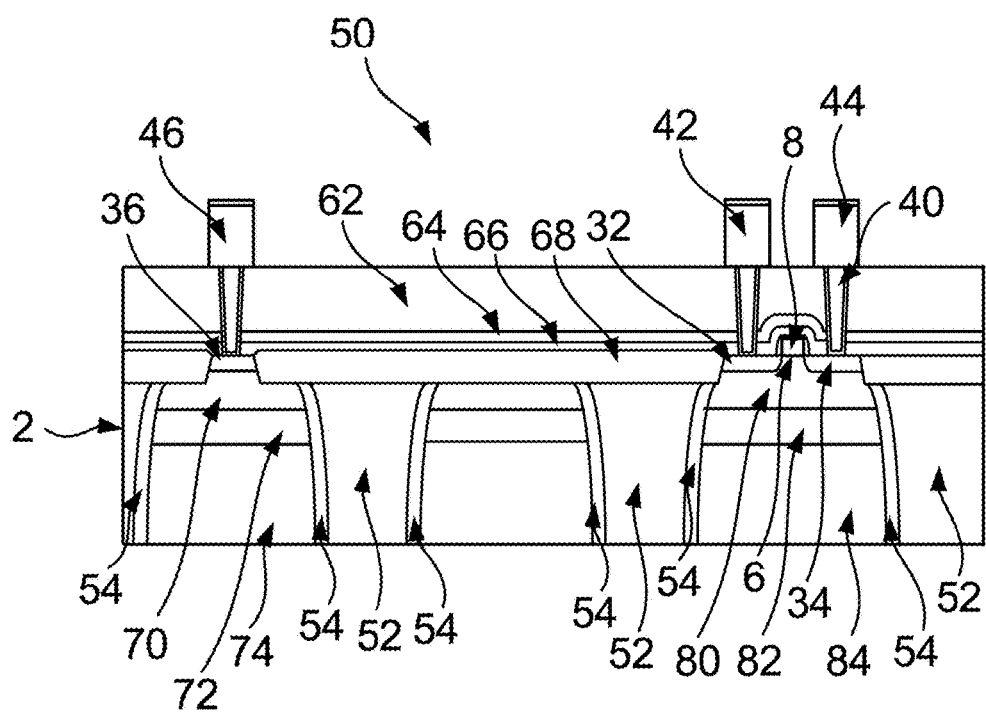
FIG. 2 shows a semiconductor switch device according to an embodiment of the present disclosure.

FIG. 2 shows a semiconductor switch device 50 according to an embodiment of the present disclosure. The device 50 in this example is an NMOS switch device for use in RF applications. The device 50 includes a MOS transistor comprising a source region 32, drain region 34, gate electrode 8, gate dielectric 6. The device also includes a body contact 36. The source region 32, drain region 34 and body contact 36 may be provided with electrical contacts 42, 44, 46, respectively (as is the gate electrode 8, although this is not shown in FIG. 2). These electrical contacts 42, 44, 46 may be connected to the source region 32, drain region 34 and body contact 36 by electrically conductive members 40 extending through one or more inter metal dielectric layers 62, 64, 66 (for example silicon oxide and silicon nitride) located provided on a major surface of the substrate 2.

The source region 32 and drain region 34 in this example are located in a p-type well 80. The body contact 36 is located in another p-type well 70. Isolations regions 68 (such as shallow trench isolation (STI)) may be used to isolate the features located in the different wells. In this example, an optional buried p+ layer 82 may be located beneath the p-type well 80, and an optional buried p+ layer 72 may be located beneath the p-type well 70. Each well and buried p+ layer is connected through the underlying parts 74, 84 of the substrate 2, which may be p− doped. The wells 70, 80 and buried layers 72, 82 may also be separated by deep trench isolation 52 (DTI). The sidewalls of the DTI may be lined with one or more dielectric layers 54, such as silicon oxide.

The source region 32, drain region 34 and gate of the device 50 shown in FIG. 2 may be formed using the method described herein (e.g. the method of FIG. 1).

Figure 3:
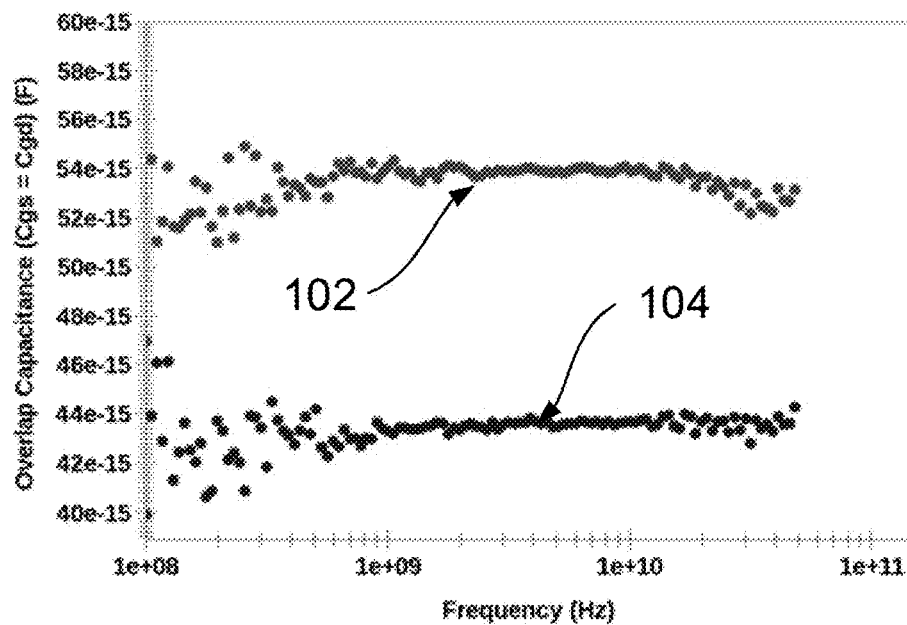
FIGS. 3 and 4 show data demonstrating the reduction in overlap capacitance and off-state capacitance in a semiconductor switch device, which may be achieved according to an embodiment of the present disclosure.
Figure 4:
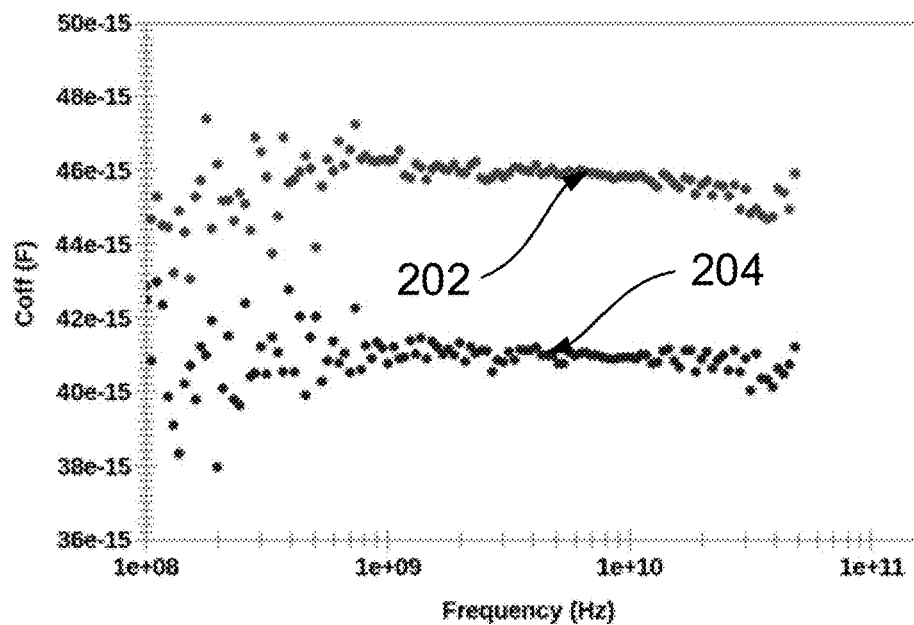

FIG. 3 shows data demonstrating the reduction in overlap capacitance in a semiconductor switch device, which may be achieved according to an embodiment of the present disclosure. FIG. 4 shows data demonstrating the reduction in off-state capacitance in a semiconductor switch device, which may be achieved according to an embodiment of the present disclosure.

For producing the data shown in FIGS. 3 and 4, RF NMOS devices were fabricated using both a conventional process flow and using a method of the kind described herein above. Note that in the case of the conventional process flow, unlike as described in relation to FIG. 1C above, the implantation process for forming lightly doped drain regions of the device was performed directly after the patterning of the gate electrode, and before the deposition of an oxide layer (such as the oxide layer 10 in FIG. 1C) for forming part of the sidewall spacers of the device.

In both FIG. 3 and FIG. 4, the capacitances of the two devices are plotted as a function of frequency. In particular: reference numeral 102 shows the overlap capacitance of the device fabricated using a conventional process; reference numeral 104 shows the overlap capacitance of the device fabricated using a method according to the present disclosure; reference numeral 202 shows $C_{off}$ of the device fabricated using the conventional process; and reference numeral 204 shows $C_{off}$ of the device fabricated using a method according to the present disclosure.

It is clearly evident from FIGS. 3 and 4 that devices fabricated according to an embodiment of this disclosure may exhibit lower overlap capacitance $C_{gd}$, $C_{gs}$ (~20% reduction) and lower off-state capacitance $C_{off}$ (~10% reduction) over a wide range of frequencies.

Accordingly, there has been described a method of making a semiconductor switch device and a semiconductor switch device made according to the method. The method includes depositing a gate dielectric on a major surface of a substrate. The method also includes depositing and patterning a gate electrode on the gate dielectric. The method further includes depositing an oxide to cover the top surface and sidewall(s) of the gate electrode. The method also includes, after depositing the oxide, performing a first ion implantation process at a first implantation dosage for forming a lightly doped drain region of the switch device. The method further includes forming sidewall spacers on the sidewall(s) of the gate electrode. The method also includes performing a second ion implantation process at a second implantation dosage for forming a source region and a drain region of the semiconductor switch device. The second implantation dosage is greater than the first implantation dosage.

Although particular embodiments of this disclosure have been described, it will be appreciated that many modifications/additions and/or substitutions may be made within the scope of the claims.

The invention claimed is:

1. A method of making a semiconductor switch device, the method comprising:
   providing a semiconductor substrate having a major surface;
   depositing a gate dielectric on the major surface of the substrate;
   depositing and patterning a gate electrode on the gate dielectric, wherein the gate electrode has a top surface, a first sidewall, and a second sidewall;
   depositing an oxide to cover the top surface and sidewall of the gate electrode, wherein a thickness of the oxide adjacent to the top surface, the first sidewall, and the second sidewall, is different than a thickness of the oxide away from the gate;
   after depositing the oxide to cover the top surface, the first sidewall and the second sidewall of the gate electrode, performing a first ion implantation process at a first implantation dosage for forming a lightly doped drain region of the switch device;
   forming respective sidewall spacers on the first sidewall and the second sidewall of the gate electrode, wherein the first ion implantation process is performed before the sidewall spacers are formed; and
   performing a second ion implantation process at a second implantation dosage for forming a source region and a drain region of the semiconductor switch device, wherein the second implantation dosage is greater than the first implantation dosage.

2. The method of claim 1, wherein the first ion implantation process for forming the lightly doped drain region comprises a single ion implantation step using a single mask.

3. The method of claim 1 comprising, prior to depositing the oxide to cover the top surface and the first sidewall and the second sidewall of the gate electrode, growing a layer of oxide on the first sidewall and the second sidewall of the gate electrode.

4. The method of claim 1, wherein the implanted ions in the first implant are Arsenic ions and wherein the implantation energy of the first implant is in the range $1<=E1<=100$ keV.

5. The method of claim 1, wherein the implanted ions in the second implant are Arsenic ions and wherein the implantation energy of the second implant is in the range $10<=E2<=200$ keV.

6. The method of claim 1, wherein the implanted ions in the first implant are Arsenic ions and wherein the first dosage is in the range $1e14<=d1<=1e16$ keV.

7. The method of claim 1, wherein the implanted ions in the second implant are Arsenic ions and wherein the second dosage is in the range $1e15<=d2<=1e16$ keV.

8. The method of claim 1, wherein the lightly doped drain region extends into the substrate to a first depth from the major surface, wherein the source and drain regions extend into the substrate to a second depth from the major surface, wherein the second depth is greater than the first depth.

9. The method of claim 1, wherein the device includes a lightly doped drain region and a lightly doped source region, and wherein said depositing and patterning the gate electrode includes determining a lateral dimension of the gate for choosing a channel length of the device according to the lateral separation between the lightly doped drain region and the lightly doped source region.

10. The method of claim 1, wherein a deposited thickness of the oxide adjacent top surface, first sidewall, and second sidewall of the gate is thicker than a deposited thickness of the oxide away from the gate.

11. The method of claim 10, wherein the first implantation energy is selected to correspond to the thicker layer of oxide adjacent the gate.

12. The method of claim 11, wherein the lightly doped drain is formed away from an edge of the gate.

13. The method of claim 1, wherein a deposited thickness of the oxide adjacent the gate is thinner than a deposited thickness of the oxide away from the gate.

14. The method of claim 13, wherein the first implantation energy is selected to correspond to the thinner layer of oxide adjacent the gate.

15. The method of claim 14, wherein the lightly doped drain is formed close to an edge of the gate.

* * * * *